United States Patent
Liao et al.

(10) Patent No.: US 9,466,598 B1
(45) Date of Patent: Oct. 11, 2016

(54) SEMICONDUCTOR STRUCTURE SUITABLE FOR ELECTROSTATIC DISCHARGE PROTECTION APPLICATION

(71) Applicant: UNITED MICROELECTRONICS CORP., Hsinchu (TW)

(72) Inventors: Yu-Cheng Liao, Douliu (TW); Yu-Chun Chen, Hsinchu County (TW); Ping-Chen Chang, Pingtung (TW); Tien-Hao Tang, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/798,564

(22) Filed: Jul. 14, 2015

(30) Foreign Application Priority Data

Jun. 25, 2015 (TW) .............................. 104120515 A

(51) Int. Cl.
*H01L 27/02* (2006.01)
*H01L 29/861* (2006.01)

(52) U.S. Cl.
CPC ....... *H01L 27/0255* (2013.01); *H01L 27/0259* (2013.01); *H01L 27/0262* (2013.01); *H01L 29/861* (2013.01)

(58) Field of Classification Search
CPC ........... H01L 27/0255; H01L 27/0259; H01L 27/0262; H01L 29/861; H01L 29/87; H01L 27/0251
See application file for complete search history.

(56) References Cited

U.S. PATENT DOCUMENTS

| | | | |
|---|---|---|---|
| 8,476,736 B2 * | 7/2013 | Lee ..................... | H01L 27/0255 257/547 |
| 8,809,905 B2 | 8/2014 | Lin et al. | |
| 9,236,374 B2 * | 1/2016 | Campi, Jr. .......... | H01L 27/0262 |
| 9,318,479 B2 * | 4/2016 | Li ........................ | H01L 27/0259 |
| 2011/0207409 A1 * | 8/2011 | Ker ..................... | H01L 27/0262 455/63.1 |
| 2015/0091054 A1 * | 4/2015 | Su ....................... | H01L 27/0248 257/140 |

* cited by examiner

*Primary Examiner* — Matthew Landau
*Assistant Examiner* — Grant Withers
(74) *Attorney, Agent, or Firm* — WPAT, PC; Justin King

(57) ABSTRACT

A semiconductor structure suitable for ESD protection application is provided. The semiconductor structure includes a first well, a second well, a third well, a first fin, a second fin, an anode, a cathode and a first doping region. The first well and the second well are disposed in the third well. The first fin is disposed on the first well. The second fin is disposed on the second well. The anode is disposed on the first fin. The cathode is disposed on the second fin. The first doping region is disposed under the first fin, and separates the first fin from the first well. The first well, the second well, the first fin and the second fin have a first doping type. The third well and the first doping region have a second doping type.

12 Claims, 13 Drawing Sheets

US 9,466,598 B1

SEMICONDUCTOR STRUCTURE SUITABLE FOR ELECTROSTATIC DISCHARGE PROTECTION APPLICATION

This application claims the benefit of Taiwan application Serial No. 104120515, filed on Jun. 25, 2015, the disclosure of which is incorporated by reference herein in its entirety.

BACKGROUND

1. Technical Field

The disclosure relates to a semiconductor structure, and more particularly to a semiconductor structure suitable for electrostatic discharge (ESD) protection application.

2. Description of the Related Art

Semiconductor devices have been developed in a trend of decreasing the sizes. Nowadays, the technology node has been developed to 22 nm, 14 nm, and even smaller. One approach to manufacture such a small semiconductor device is FinFET technology. However, a conventional ESD protection structure is not fabricated using the "fin(s)". Nevertheless, the ESD protection structure is necessary for protecting the semiconductor device from damage caused by ESD. As such, a semiconductor device applying FinFET technology may need an additional space-occupying ESD protection structure. This is disadvantageous for size decrease of the semiconductor devices.

SUMMARY

In this disclosure, a semiconductor structure applying FinFET technology is provided. The semiconductor structure is suitable for ESD protection application.

According to some embodiments, the semiconductor structure comprises a first well, a second well, a third well, a first fin, a second fin, an anode, a cathode and a first doping region. The first well has a first doping type. The second well has the first doping type. The third well has a second doping type. The first well and the second well are disposed in the third well. The first fin is disposed on the first well. The first fin has the first doping type. The second fin is disposed on the second well. The second fin has the first doping type. The anode is disposed on the first fin. The cathode is disposed on the second fin. The first doping region is disposed under the first fin. The first doping region separates the first fin from the first well. The first doping region has the second doping type.

Figure 1A:
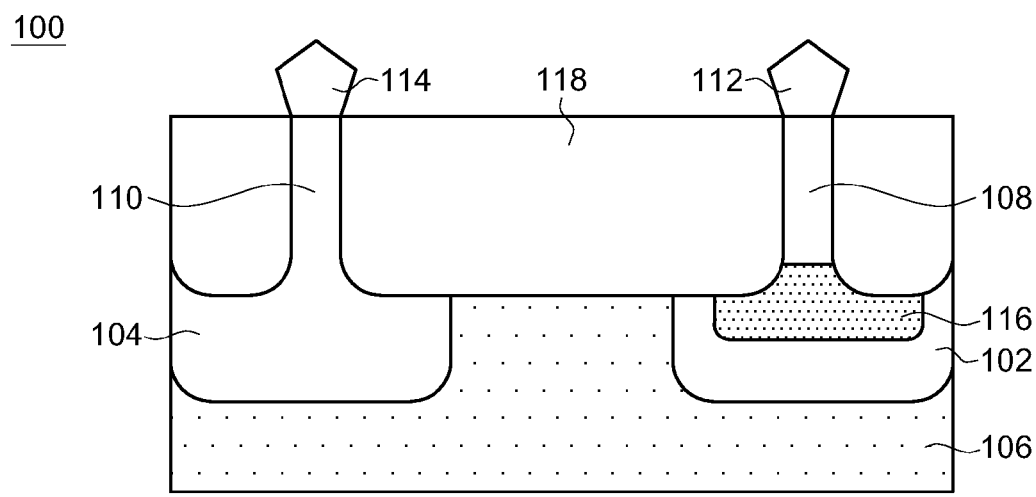
FIGS. 1A-1C show a semiconductor structure according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

A semiconductor structure according to this disclosure comprises a first well, a second well, a third well, a first fin, a second fin, an anode, a cathode and a first doping region. The first well and the second well are disposed in the third well. The first fin is disposed on the first well. The second fin is disposed on the second well. The anode is disposed on the first fin. The cathode is disposed on the second fin. The first doping region is disposed under the first fin. The first doping region separates the first fin from the first well. The first well, the second well, the first fin and the second fin have a first doping type. The third well and the first doping region have a second doping type. The semiconductor structure may comprise a p-n-p-n silicon-controlled rectifier (SCR), and the first doping region and the first well belong to it.

Now, various embodiments are provided for improving the understanding of this disclosure. In most cases, the elements given the same name are substantially the same, even though they may be indicated by different reference numerals. As such, other than the dissimilar features, the related description (such as their materials, doping concentrations, and the like) may not be repeated again.

Figure 1B:
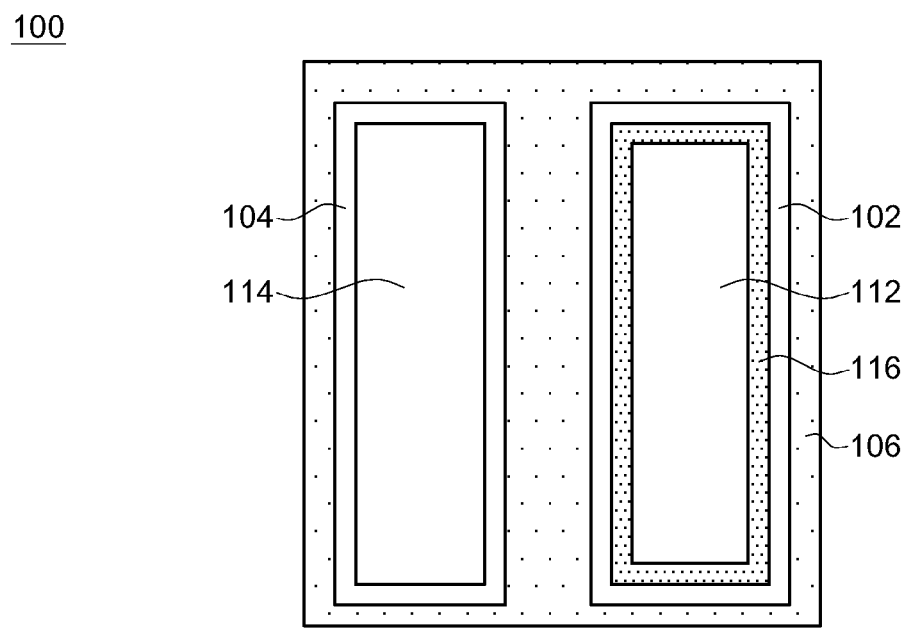
Figure 1C:
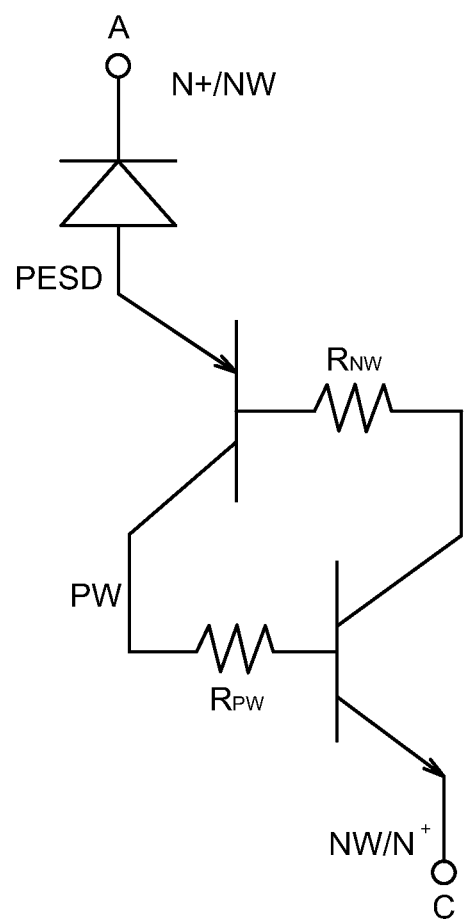

Referring to FIGS. 1A-1C, a semiconductor structure 100 according to one embodiment is shown, wherein FIG. 1A is a cross-sectional view, FIG. 1B is a top view, and FIG. 1C is a circuit diagram of the semiconductor structure 100. The semiconductor structure 100 comprises a first well 102, a second well 104, a third well 106, a first fin 108, a second fin 110, an anode 112 (indicated by A in the circuit diagram), a cathode 114 (indicated by C in the circuit diagram) and a first doping region 116 (indicated by PESD in the circuit diagram). The first well 102 has a first doping type. The second well 104 has the first doping type. The third well 106 has a second doping type. The first well 102 and the second well 104 are disposed in the third well 106. In this embodiment, the first well 102 and the second well 104 are separated from each other by the third well 106. The first fin 108 is disposed on the first well 102. The first fin 108 has the first doping type. The second fin 110 is disposed on the second well 104. The second fin 110 has the first doping type. The anode 112 is disposed on the first fin 108. The cathode 114 is disposed on the second fin 110. In this embodiment, the anode 112 has the first doping type, and the cathode 114 has the first doping type. The first doping region 116 is disposed under the first fin 108. The first doping region 116 separates the first fin 108 from the first well 102. For example, as shown in FIG. 1, the first doping region 116 may have a horizontal size larger than a horizontal size of the first fin 108, so as to separate the first fin 108 from the first well 102. The first doping region 116 has the second doping type. The semiconductor structure 100 may further comprise a shallow trench isolation (STI) structure 118. The STI structure 118 spatially and electrically isolates the second fin 110 from the first fin 108.

For example, the first doping type may be n-type, and the second doping type may be p-type. The doping concentrations of the n-type first well 102, second well 104, first fin 108 and second fin 110 may be about $10^{15}$ to about $10^{16}$ cm$^{-3}$. The doping concentration of the p-type third well 106 may be about $10^{15}$ to about $10^{16}$ cm$^{-3}$. The doping concentrations of the n-type anode 112 and cathode 114 may be about $10^{19}$ to about $10^{21}$ cm$^{-3}$. The doping concentration of the p-type first doping region 116 may be about $10^{17}$ to about $10^{18}$ cm$^{-3}$. The base material may be silicon (Si), germanium-doped silicon (Ge-doped Si), carbon-doped silicon (C-doped Si), germanium (Ge), SiGe, or III-V semiconductor such as GaAs, InGaAs, InSb, InAs, GaSb, InP, or the like. The n-type implant may be phosphorus (P), arsenic (As), or the like. The p-type implant may be boron (B), BF$_2$, or the like.

In the case that the first doping type is n-type and the second doping type is p-type, the first fin 108 and the first doping region 116 constitute a n-p diode. The first doping region 116, the first well 102, the third well 106 and the second well 104 constitute a p-n-p-n SCR. By such arrangement, the semiconductor structure 100 can have a high holding voltage. For example, the holding voltage may be higher than 3.3 V, or even higher than 5 V. This is beneficial for the ESD protection application. However, it will be appreciated that the holding voltage can be designed according to V$_{DD}$ of the circuit.

Figure 2A:
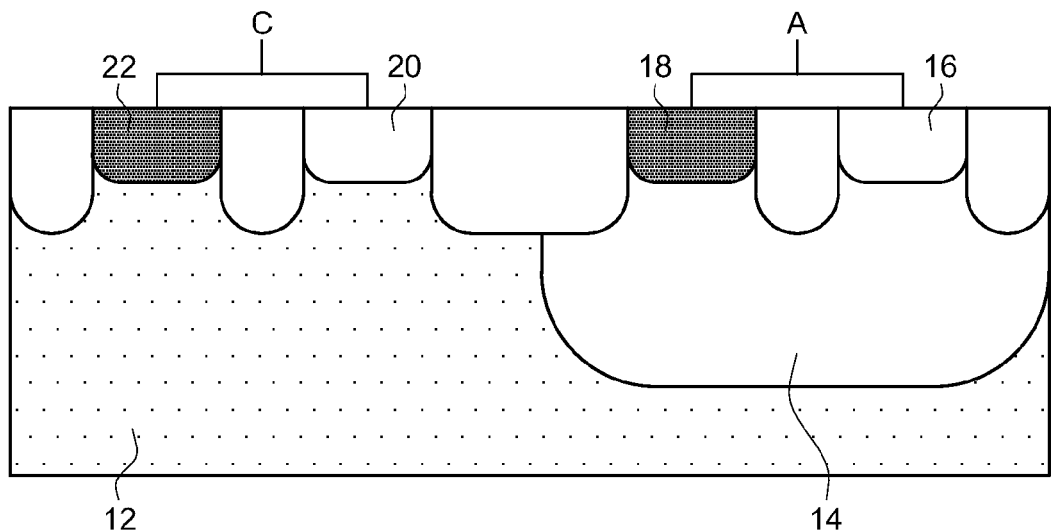
FIGS. 2A-2B show a conventional ESD protection structure.
Figure 2B:
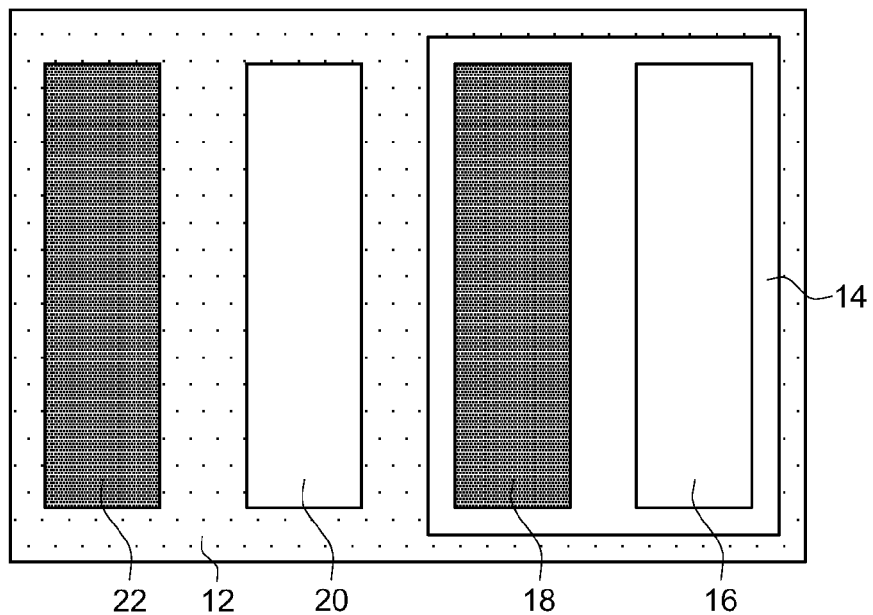

Further, the configuration of the semiconductor structure 100 is beneficial for size decrease. FIGS. 2A-2B show a conventional ESD protection structure 10, wherein FIG. 2A is a cross-sectional view, and FIG. 2B is a top view of the ESD protection structure 10. The ESD protection structure 10 comprises a first well 12, a second well 14, a first heavily-doped region 16, a second heavily-doped region 18, a third heavily-doped region 20 and a fourth heavily-doped region 22. The first well 12 has the second doping type. The second well 14 is disposed in the first well 12. The second well 14 has the first doping type. The first heavily-doped region 16 and the second heavily-doped region 18 are disposed in the second well 14. The first heavily-doped region 16 has the first doping type. The second heavily-doped region 18 has the second doping type. The third heavily-doped region 20 and the fourth heavily-doped region 22 are disposed in the first well 12. The third heavily-doped region 20 has the first doping type. The fourth heavily-doped region 22 has the second doping type. The first heavily-doped region 16 and the second heavily-doped region 18 are used as an anode (A), and the third heavily-doped region 20 and the fourth heavily-doped region 22 are used as a cathode (C). Compared to the ESD protection structure 10, the needed area of the semiconductor structure 100 can be reduced about 50%.

Figure 3:
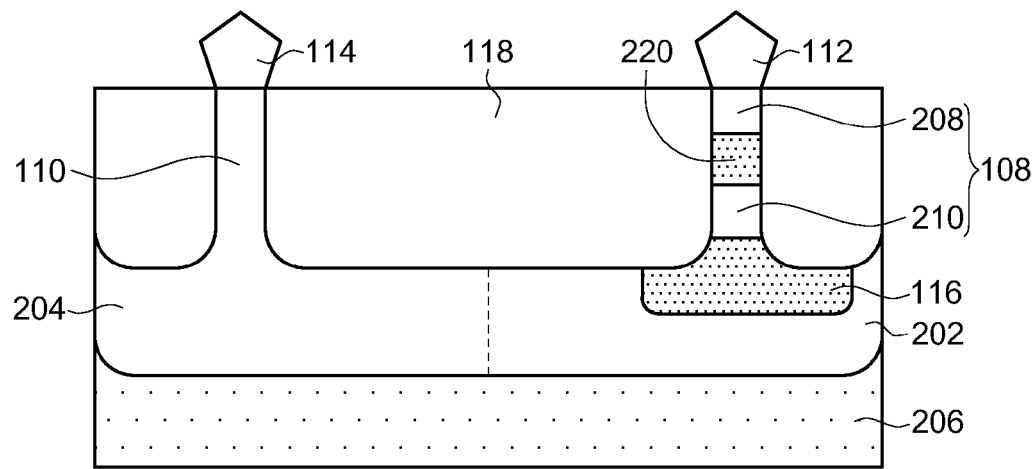
FIG. 3 shows a semiconductor structure according to one embodiment.

Referring to FIG. 3, a semiconductor structure 200 according to one embodiment is shown. In this embodiment, the anode 112 has the first doping type, and the cathode 114 has the first doping type. In this embodiment, the first well 202 and the second well 204 are connected to each other. In fact, the first well 202 and the second well 204 may be integrated into one well without a portion of the third well 206 disposed therebetween, as shown in FIG. 3. In this embodiment, the semiconductor structure 200 further comprises a second doping region 220. The second doping region 220 is disposed in the first fin 108. The second doping region 220 separates the first fin 108 into an upper part 208 and a lower part 210. The second doping region 220 has the second doping type. The doping concentration of the second doping region 220 may be about $10^{17}$ to about $10^{18}$ cm$^{-3}$. The base material and the implant described previously may be used.

In the case that the first doping type is n-type and the second doping type is p-type, the upper part 208 of the first fin 108 and the second doping region 220 constitute a n-p diode. The second doping region 220, the lower part 210 of the first fin 108, the first doping region 116 and the first well 202 constitute a p-n-p-n SCR. By such arrangement, the semiconductor structure 200 can have a high holding voltage.

Figure 4:
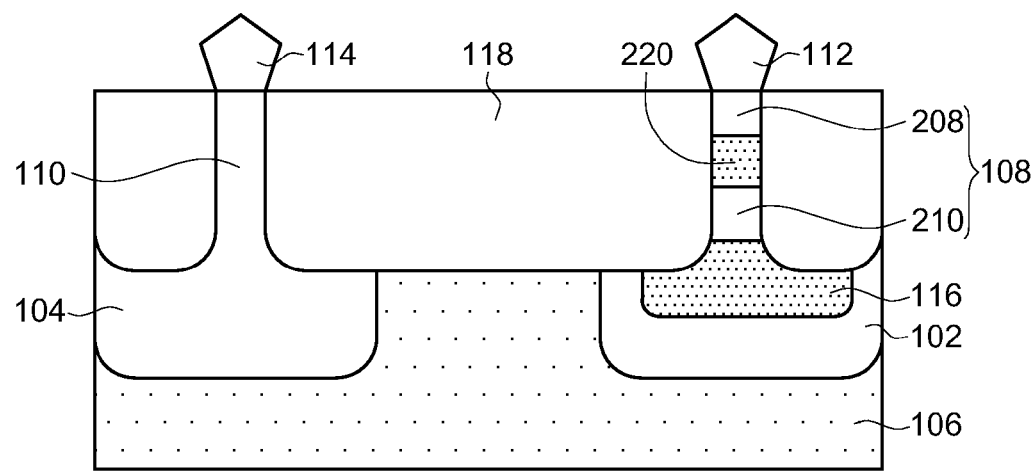
FIG. 4 shows a semiconductor structure according to one embodiment.

Referring to FIG. 4, a semiconductor structure 300 according to one embodiment is shown. In this embodiment, the anode 112 has the first doping type, and the cathode 114 has the first doping type. In this embodiment, the semiconductor structure 300 further comprises a second doping region 220, which is disposed in the first fin 108 and separates the first fin 108 into an upper part 208 and a lower part 210. In this embodiment, the first well 102 and the second well 104 are separated from each other by the third well 106.

In the case that the first doping type is n-type and the second doping type is p-type, the upper part 208 of the first fin 108 and the second doping region 220 constitute a n-p diode. The second doping region 220, the lower part 210 of the first fin 108 and the first doping region 116 constitute a p-n-p BJT. The first doping region 116, the first well 102, the third well 106 and the second well 104 constitute a p-n-p-n SCR. From another aspect of view, the second doping region 220, the lower part 210 of the first fin 108, the first doping region 116 and the first well 102 constitute a p-n-p-n SCR, and the first doping region 116, the first well 102, the third well 106 and the second well 104 constitute another p-n-p-n SCR. By such arrangement, the semiconductor structure 300 can have a high holding voltage.

Figure 5:
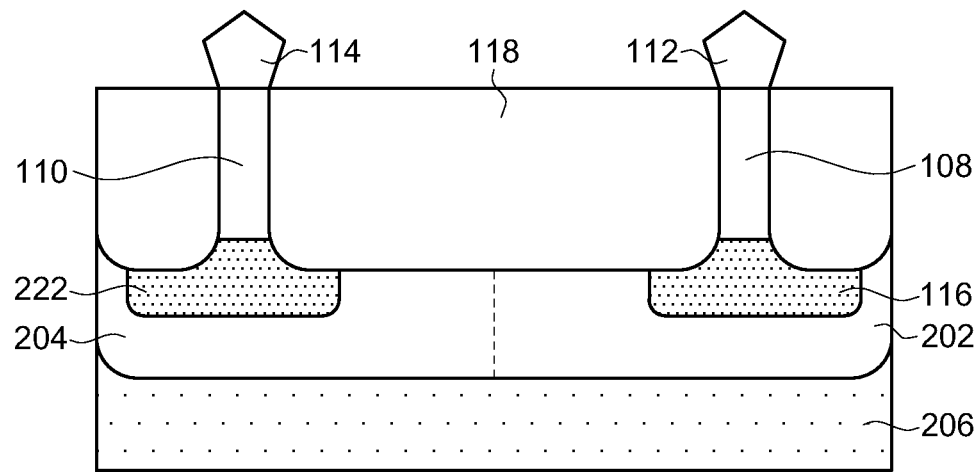
FIG. 5 shows a semiconductor structure according to one embodiment.

Referring to FIG. 5, a semiconductor structure 400 according to one embodiment is shown. In this embodiment, the anode 112 has the first doping type, and the cathode 114 has the first doping type. In this embodiment, the first well 202 and the second well 204 are connected to each other. In this embodiment, the semiconductor structure 400 further comprises a second doping region 222. The second doping region 222 is disposed under the second fin 110. The second doping region 222 separates the second fin 110 from the second well 204. For example, second doping region 222 may have a horizontal size larger than a horizontal size of the second fin 110, so as to separate the second fin 110 from the second well 204. The second doping region 222 has the second doping type. The doping concentration of the second doping region 222 may be about $10^{17}$ to about $10^{18}$ cm$^{-3}$. The base material and the implant described previously may be used.

In the case that the first doping type is n-type and the second doping type is p-type, the first fin 108 and the first doping region 116 constitute a n-p diode. The first doping region 116, the first and second wells 202 and 204, the second doping region 222 and the second fin 110 constitute a p-n-p-n SCR. By such arrangement, the semiconductor structure 400 can have a high holding voltage.

Figure 6A:
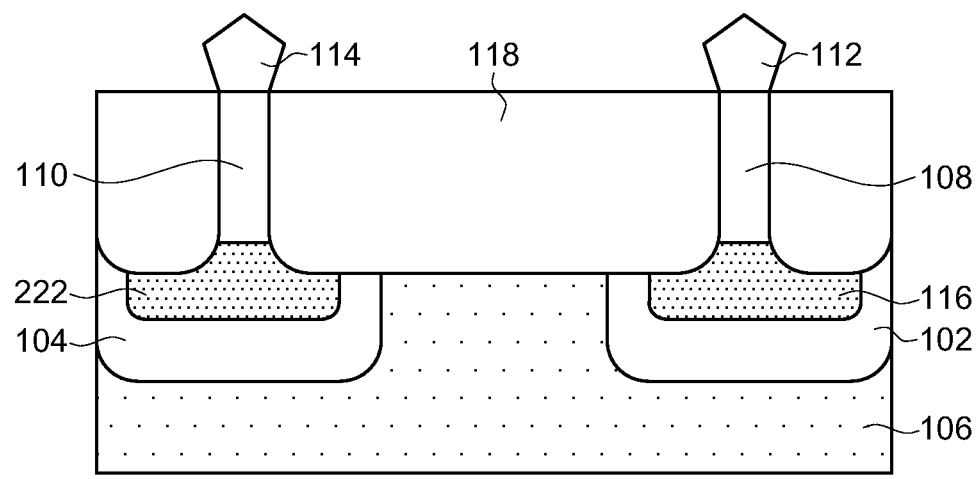
FIGS. 6A-6B show a semiconductor structure according to one embodiment.
Figure 6B:
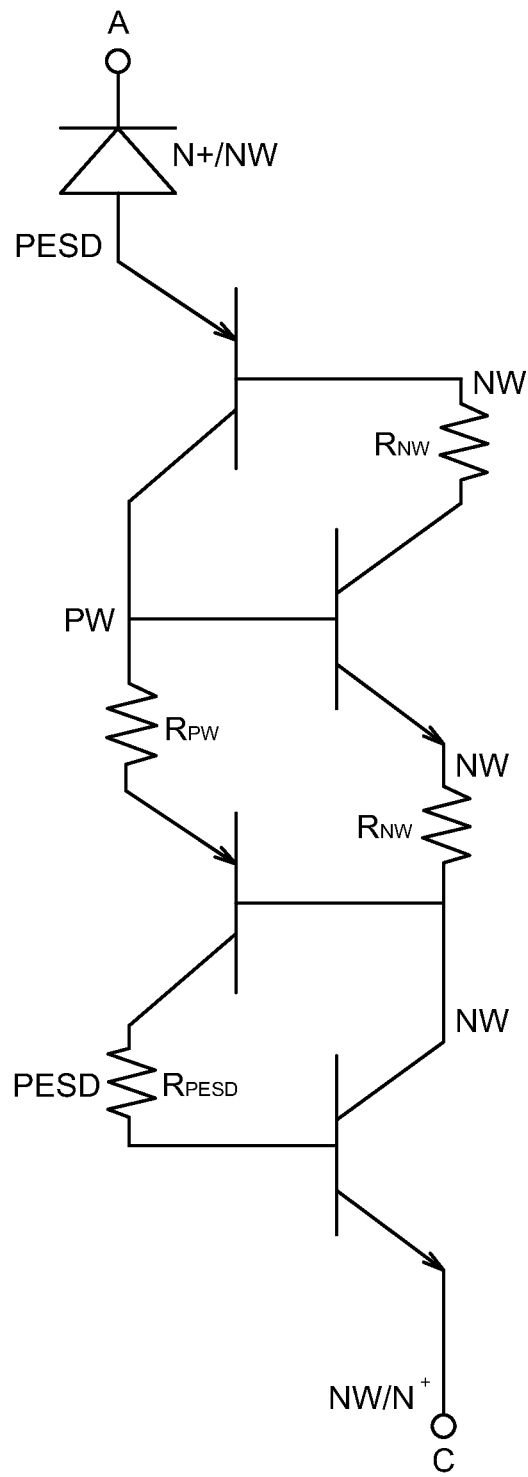

Referring to FIGS. 6A-6B, a semiconductor structure 500 according to one embodiment is shown, wherein FIG. 6A is a cross-sectional view, and FIG. 6B is a circuit diagram of the semiconductor structure 500. In this embodiment, the anode 112 (indicated by A in the circuit diagram) has the first doping type, and the cathode 114 (indicated by C in the circuit diagram) has the first doping type. In this embodiment, the first well 102 and the second well 104 are separated from each other by the third well 106. In this embodiment, the semiconductor structure 500 further comprises a second doping region 222 (indicated by PESD in the circuit diagram), which is disposed under the second fin 110 and separates the second fin 110 from the second well 104.

In the case that the first doping type is n-type and the second doping type is p-type, the first fin 108 and the first doping region 116 (indicated by PESD in the circuit diagram) constitute a n-p diode. The first doping region 116, the first well 102 and the third well 106 constitute a p-n-p BJT. The third well 106, the second well 104, the second doping region 222 and the second fin 110 constitute a p-n-p-n SCR. From another aspect of view, the first doping region 116, the first well 102, the third well 106 and the second well 104 constitute a p-n-p-n SCR, and the third well 106, the second well 104, the second doping region 222 and the second fin 110 constitute another p-n-p-n SCR. By such arrangement, the semiconductor structure 500 can have a high holding voltage.

Figure 7A:
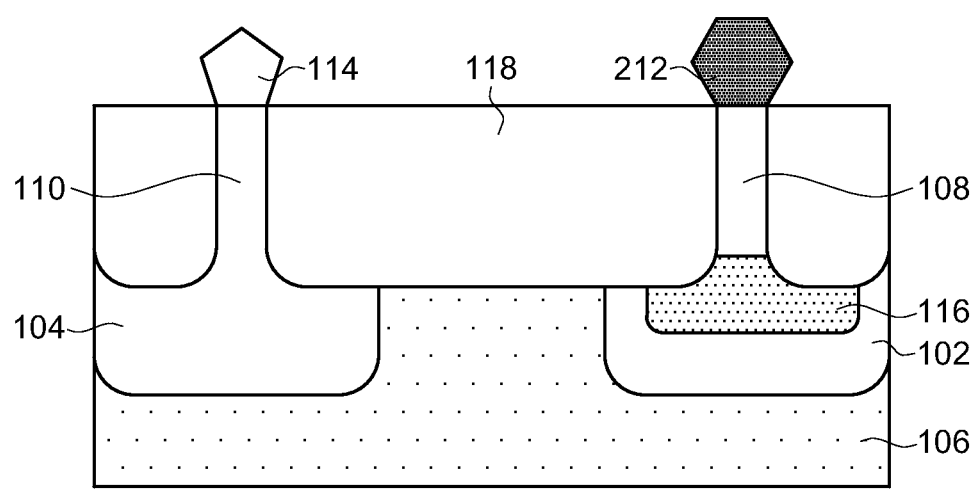
FIGS. 7A-7B show a semiconductor structure according to one embodiment.
Figure 7B:
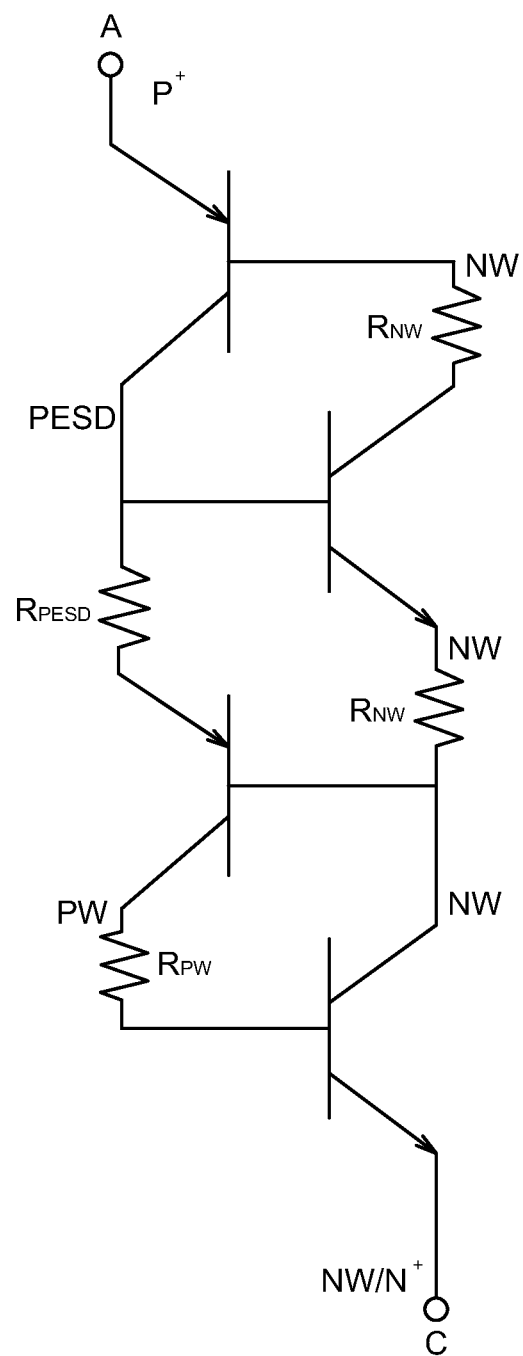

Referring to FIGS. 7A-7B, a semiconductor structure 600 according to one embodiment is shown, wherein FIG. 7A is a cross-sectional view, and FIG. 7B is a circuit diagram of the semiconductor structure 600. In this embodiment, the anode 212 (indicated by A in the circuit diagram) has the second doping type, and the cathode 114 (indicated by C in the circuit diagram) has the first doping type. The doping concentration of the anode 212 may be about $10^{19}$ to about $10^{21}$ cm$^{-3}$. The base material and the implant described previously may be used. In this embodiment, the first well 102 and the second well 104 are separated from each other by the third well 106.

In the case that the first doping type is n-type and the second doping type is p-type, the anode 212, the first fin 108 and the first doping region 116 (indicated by PESD in the circuit diagram) constitute a p-n-p BJT. The first doping region 116, the first well 102, the third well 106 and the second well 104 constitute a p-n-p-n SCR. By such arrangement, the semiconductor structure 600 can have a high trigger voltage. For example, the trigger voltage may be higher than 8 V. However, it will be appreciated that the trigger voltage can be designed as needed.

Figure 8:
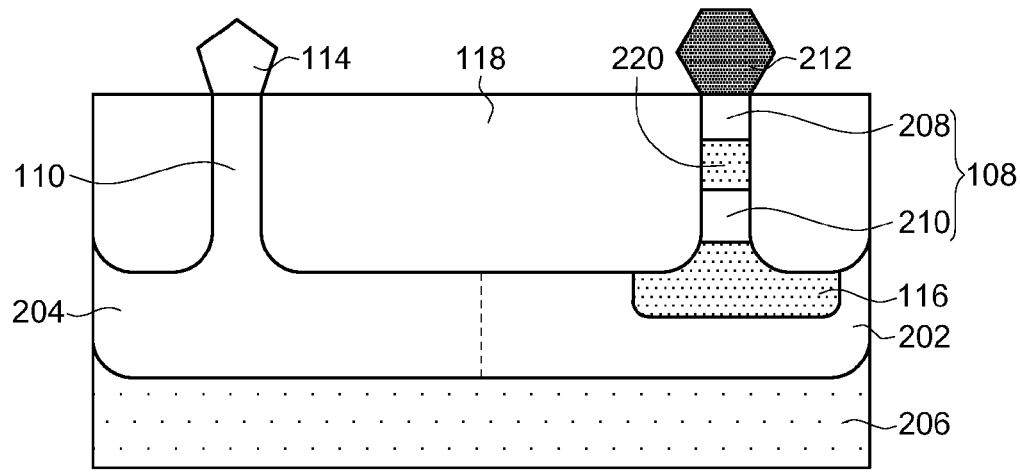
FIG. 8 shows a semiconductor structure according to one embodiment.

Referring to FIG. 8, a semiconductor structure 700 according to one embodiment is shown. In this embodiment, the anode 212 has the second doping type, and the cathode 114 has the first doping type. In this embodiment, the semiconductor structure 700 further comprises a second doping region 220, which is disposed in the first fin 108 and separates the first fin 108 into an upper part 208 and a lower part 210. In this embodiment, the first well 202 and the second well 204 are connected to each other.

In the case that the first doping type is n-type and the second doping type is p-type, the anode 212, the upper part 208 of the first fin 108 and the second doping region 220 constitute a p-n-p BJT. The second doping region 220, the lower part 210 of the first fin 108, the first doping region 116 and the first well 202 constitute a p-n-p-n SCR. By such arrangement, the semiconductor structure 700 can have a high trigger voltage.

Figure 9:
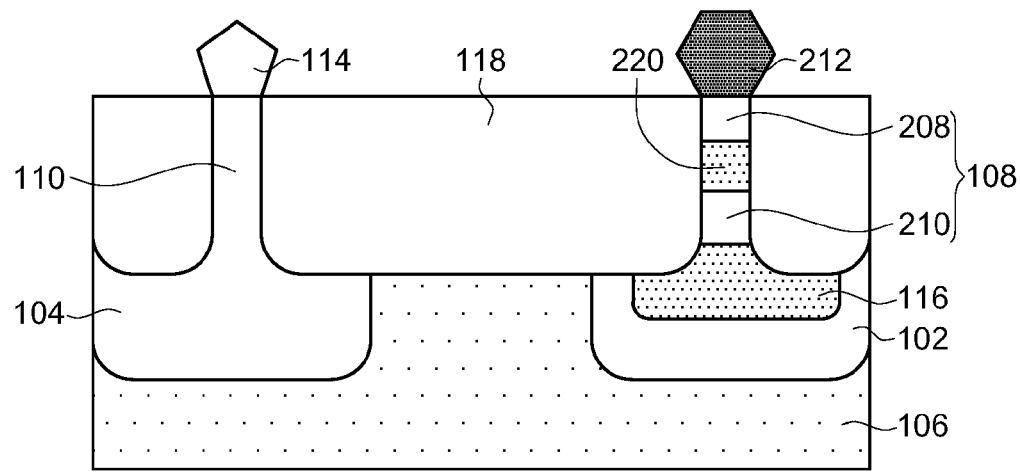
FIG. 9 shows a semiconductor structure according to one embodiment.

Referring to FIG. 9, a semiconductor structure 800 according to one embodiment is shown. In this embodiment, the anode 212 has the second doping type, and the cathode 114 has the first doping type. In this embodiment, the semiconductor structure 800 further comprises a second doping region 220, which is disposed in the first fin 108 and separates the first fin 108 into an upper part 208 and a lower part 210. In this embodiment, the first well 102 and the second well 104 are separated from each other by the third well 106.

In the case that the first doping type is n-type and the second doping type is p-type, the anode 212, the upper part 208 of the first fin 108 and the second doping region 220 constitute a p-n-p BJT. The second doping region 220, the lower part 210 of the first fin 108, the first doping region 116 and the first well 102 constitute a p-n-p-n SCR. The first doping region 116, the first well 102, the third well 106 and the second well 104 constitute another p-n-p-n SCR. By such arrangement, the semiconductor structure 800 can have a high trigger voltage.

Figure 10:
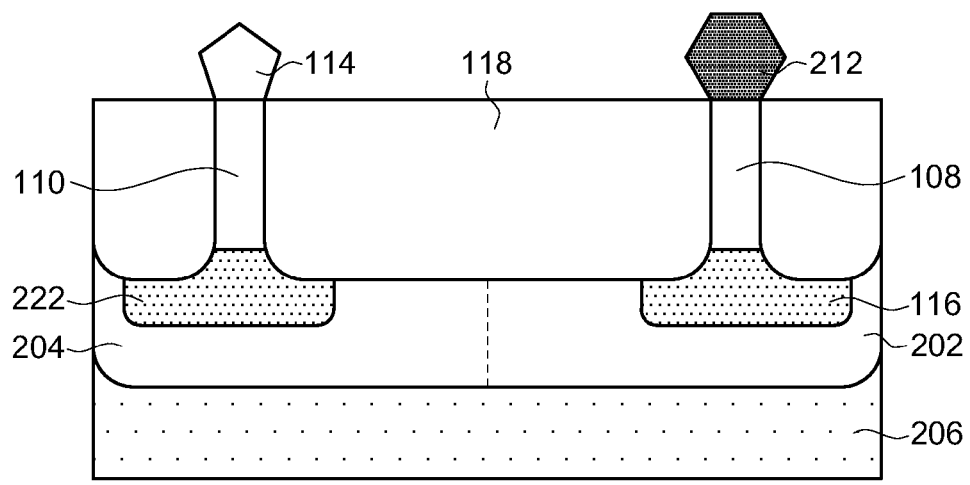
FIG. 10 shows a semiconductor structure according to one embodiment.

Referring to FIG. 10, a semiconductor structure 900 according to one embodiment is shown. In this embodiment, the anode 212 has the second doping type, and the cathode 114 has the first doping type. In this embodiment, the first well 202 and the second well 204 are connected to each other. In this embodiment, the semiconductor structure 900 further comprises a second doping region 222, which is disposed under the second fin 110 and separates the second fin 110 from the second well 204.

In the case that the first doping type is n-type and the second doping type is p-type, the anode 212, the first fin 108 and the first doping region 116 constitute a p-n-p BJT. The first doping region 116, the first and second wells 202 and 204, the second doping region 222 and the second fin 110 constitute a p-n-p-n SCR. By such arrangement, the semiconductor structure 900 can have a high trigger voltage.

Figure 11:
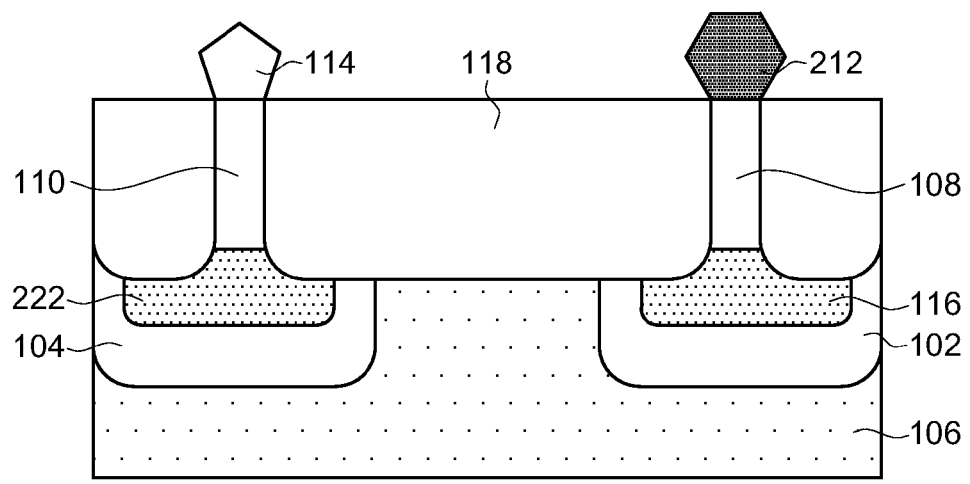
FIG. 11 shows a semiconductor structure according to one embodiment.

Referring to FIG. 11, a semiconductor structure 1000 according to one embodiment is shown. In this embodiment, the anode 212 has the second doping type, and the cathode 114 has the first doping type. In this embodiment, the first well 102 and the second well 104 are separated from each other by the third well 106. In this embodiment, the semiconductor structure 1000 further comprises a second doping region 222, which is disposed under the second fin 110 and separates the second fin 110 from the second well 104.

In the case that the first doping type is n-type and the second doping type is p-type, the anode 212, the first fin 108 and the first doping region 116 constitute a p-n-p BJT. The first doping region 116, the first well 102, the third well 106 and the second well 104 constitute a p-n-p-n SCR. The third well 106, the second well 104, the second doping region 222 and the second fin 110 constitute another p-n-p-n SCR. By such arrangement, the semiconductor structure 1000 can have a high trigger voltage.

Figure 12:
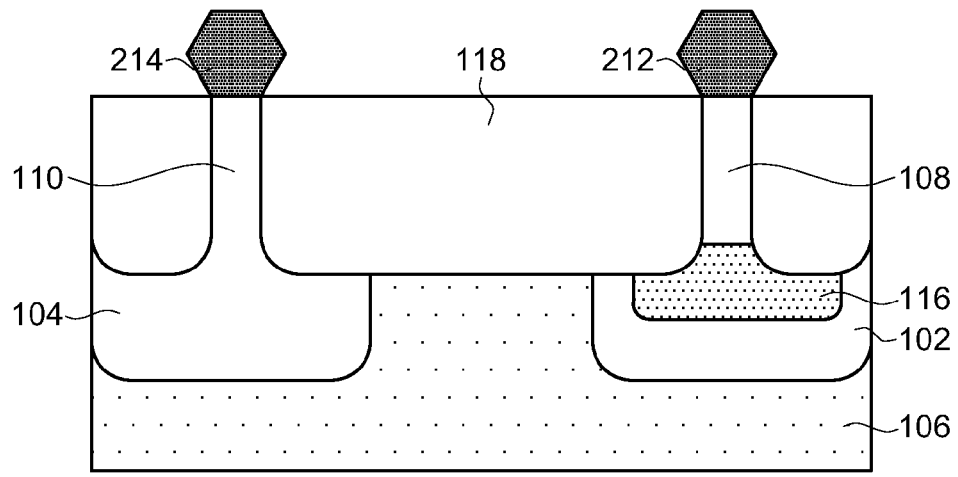
FIG. 12 shows a semiconductor structure according to one embodiment.

Referring to FIG. 12, a semiconductor structure 1100 according to one embodiment is shown. In this embodiment, the anode 212 has the second doping type, and the cathode 214 has the second doping type. The doping concentrations of the anode 212 and the cathode 214 may be about $10^{19}$ to about $10^{21}$ cm$^{-3}$. The base material and the implant described previously may be used. In this embodiment, the first well 102 and the second well 104 are separated from each other by the third well 106.

In the case that the first doping type is n-type and the second doping type is p-type, the anode 212, the first fin 108 and the first doping region 116 constitute a p-n-p BJT. The first doping region 116, the first well 102, the third well 106 and the second well 104 constitute a p-n-p-n SCR. By such arrangement, the semiconductor structure 1100 can have a high trigger voltage. Further, since both the anode 212 and the cathode 214 have the second doping type, the semiconductor structure 1100 is bi-directional.

Figure 13:
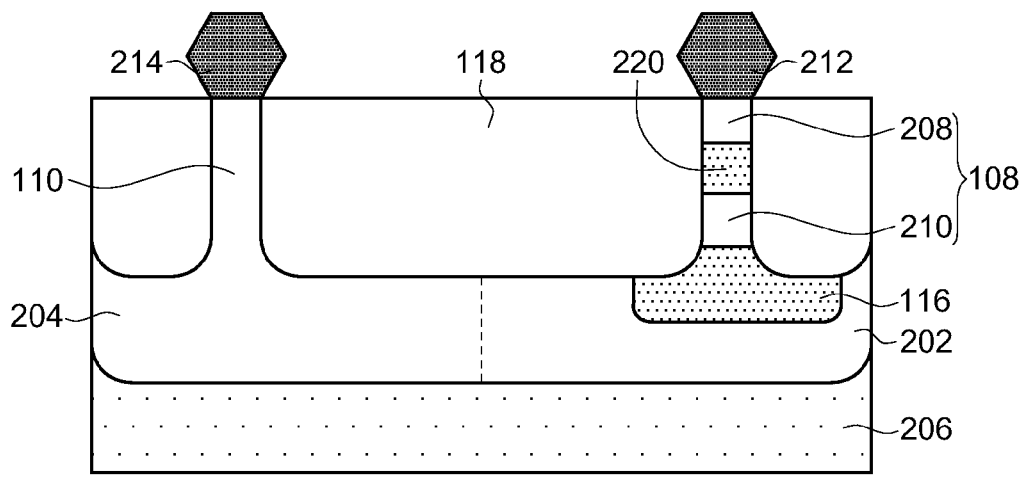
FIG. 13 shows a semiconductor structure according to one embodiment.

Referring to FIG. 13, a semiconductor structure 1200 according to one embodiment is shown. In this embodiment, the anode 212 has the second doping type, and the cathode 214 has the second doping type. In this embodiment, the semiconductor structure 1200 further comprises a second doping region 220, which is disposed in the first fin 108 and separates the first fin 108 into an upper part 208 and a lower part 210. In this embodiment, the first well 202 and the second well 204 are connected to each other.

In the case that the first doping type is n-type and the second doping type is p-type, the anode 212, the upper part 208 of the first fin 108 and the second doping region 220 constitute a p-n-p BJT. The second doping region 220, the lower part 210 of the first fin 108, the first doping region 116 and the first well 202 constitute a p-n-p-n SCR. By such arrangement, the semiconductor structure 1200 can have a high trigger voltage. Further, since both the anode 212 and the cathode 214 have the second doping type, the semiconductor structure 1200 is bi-directional.

Figure 14:
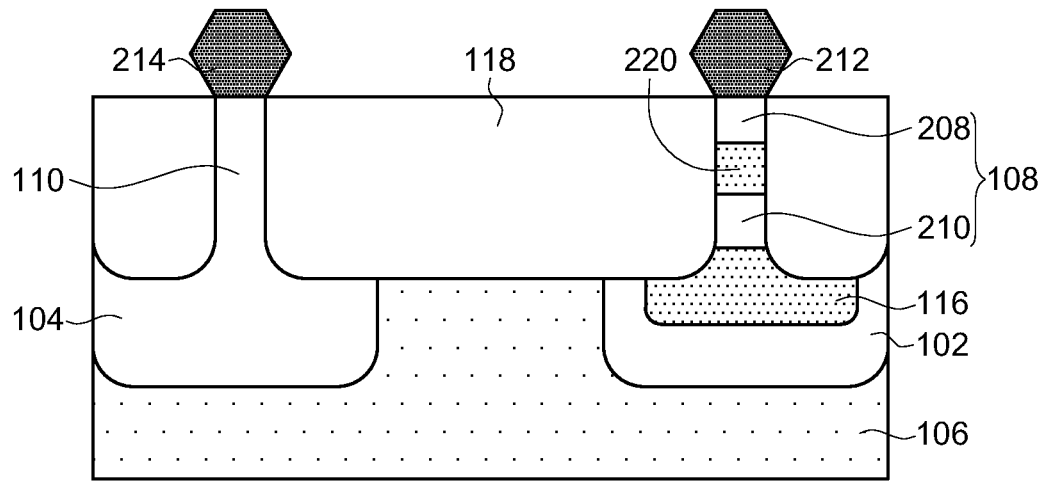
FIG. 14 shows a semiconductor structure according to one embodiment.

Referring to FIG. 14, a semiconductor structure 1300 according to one embodiment is shown. In this embodiment, the anode 212 has the second doping type, and the cathode 214 has the second doping type. In this embodiment, the semiconductor structure 1300 further comprises a second doping region 220, which is disposed in the first fin 108 and separates the first fin 108 into an upper part 208 and a lower part 210. In this embodiment, the first well 102 and the second well 104 are separated from each other by the third well 106.

In the case that the first doping type is n-type and the second doping type is p-type, the anode 212, the upper part 208 of the first fin 108 and the second doping region 220 constitute a p-n-p BJT. The second doping region 220, the lower part 210 of the first fin 108, the first doping region 116 and the first well 102 constitute a p-n-p-n SCR. The first doping region 116, the first well 102, the third well 106 and the second well 104 constitute another p-n-p-n SCR. By such arrangement, the semiconductor structure 1300 can have a high trigger voltage. Further, since both the anode 212 and the cathode 214 have the second doping type, the semiconductor structure 1300 is bi-directional.

Figure 15:
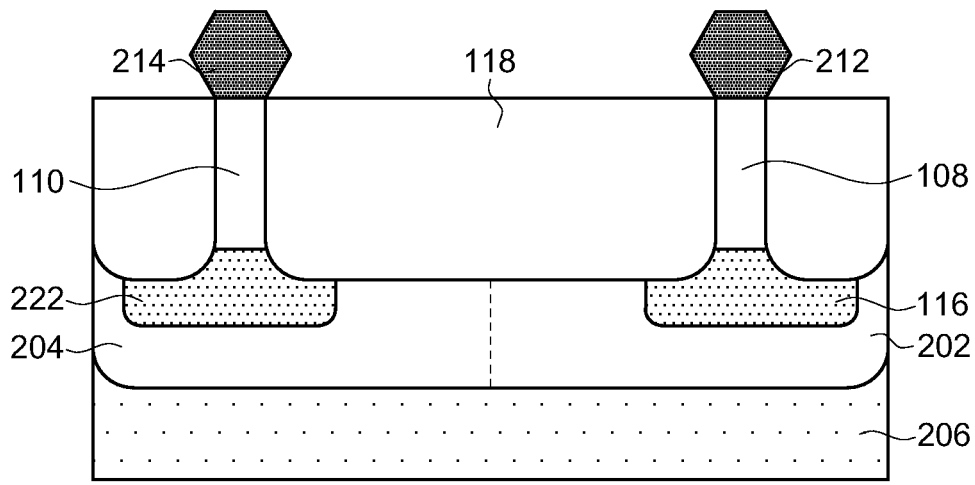
FIG. 15 shows a semiconductor structure according to one embodiment.

Referring to FIG. 15, a semiconductor structure 1400 according to one embodiment is shown. In this embodiment, the anode 212 has the second doping type, and the cathode 214 has the second doping type. In this embodiment, the first well 202 and the second well 204 are connected to each other. In this embodiment, the semiconductor structure 1400 further comprises a second doping region 222, which is disposed under the second fin 110 and separates the second fin 110 from the second well 204.

In the case that the first doping type is n-type and the second doping type is p-type, the anode 212, the first fin 108 and the first doping region 116 constitute a p-n-p BJT. The first doping region 116, the first and second wells 202 and 204, the second doping region 222 and the second fin 110 constitute a p-n-p-n SCR. By such arrangement, the semiconductor structure 1400 can have a high trigger voltage. Further, since both the anode 212 and the cathode 214 have the second doping type, the semiconductor structure 1400 is bi-directional.

Figure 16:
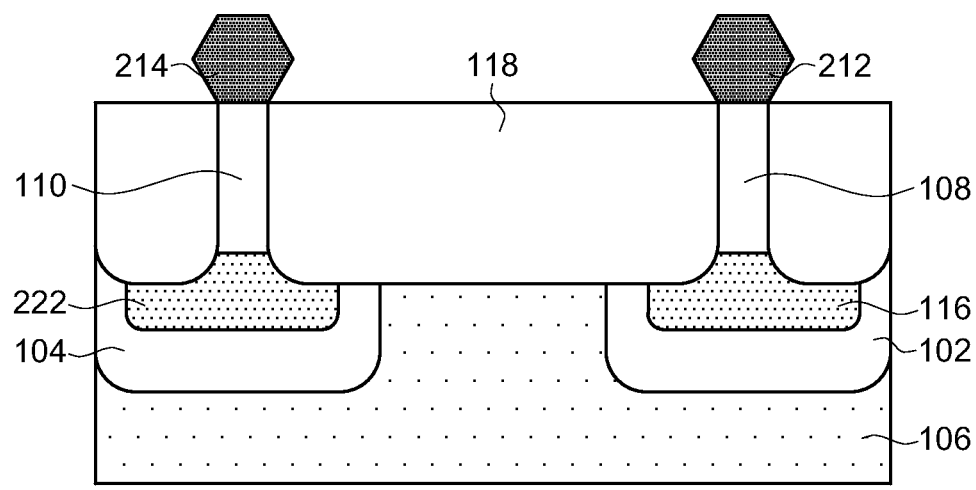
FIG. 16 shows a semiconductor structure according to one embodiment.

Referring to FIG. 16, a semiconductor structure 1500 according to one embodiment is shown. In this embodiment, the anode 212 has the second doping type, and the cathode 214 has the second doping type. In this embodiment, the first well 102 and the second well 104 are separated from each other by the third well 106. In this embodiment, the semiconductor structure 1500 further comprises a second doping region 222, which is disposed under the second fin 110 and separates the second fin 110 from the second well 104.

In the case that the first doping type is n-type and the second doping type is p-type, the anode 212, the first fin 108 and the first doping region 116 constitute a p-n-p BJT. The first doping region 116, the first well 102, the third well 106 and the second well 104 constitute a p-n-p-n SCR. The third well 106, the second well 104, the second doping region 222 and the second fin 110 constitute another p-n-p-n SCR. By such arrangement, the semiconductor structure 1500 can have a high trigger voltage. Further, since both the anode 212 and the cathode 214 have the second doping type, the semiconductor structure 1500 is bi-directional.

A plurality of embodiments have been provided in this disclosure. The semiconductor structure according to the embodiments is particularly suitable for being used in ESD protection application. The semiconductor structure according to the embodiments has a compact layout. Further, one semiconductor structure according to these embodiments may have its own feature, such as having high holding voltage, having high trigger voltage, and/or bi-directional.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprising:
a first well having a first doping type;
a second well having the first doping type;
a third well having a second doping type, wherein the first well and the second well are disposed in the third well;
a first fin disposed on the first well, the first fin having the first doping type;
a second fin disposed on the second well, the second fin having the first doping type;
an anode disposed on the first fin;
a cathode disposed on the second fin; and
a first doping region disposed under the first fin, the first doping region separating the first fin from the first well, the first doping region having the second doping type.

2. The semiconductor structure according to claim 1, wherein the first doping region has a horizontal size larger than a horizontal size of the first fin.

3. The semiconductor structure according to claim 1, wherein the anode has the first doping type, and the cathode has the first doping type.

4. The semiconductor structure according to claim 3, wherein the first doping region and the first well belong to a p-n-p-n SCR.

5. The semiconductor structure according to claim 1, wherein the anode has the second doping type, and the cathode has the first doping type.

6. The semiconductor structure according to claim 1, wherein the anode has the second doping type, and the cathode has the second doping type.

7. The semiconductor structure according to claim 1, wherein the first well and the second well are connected to each other.

8. The semiconductor structure according to claim 1, wherein the first well and the second well are separated from each other by the third well.

9. The semiconductor structure according to claim 1, further comprising:
   a second doping region disposed in the first fin, the second doping region separating the first fin into an upper part and a lower part, the second doping region having the second doping type.

10. The semiconductor structure according to claim 1, further comprising:
    a second doping region disposed under the second fin, the second doping region separating the second fin from the second well, the second doping region having the second doping type.

11. The semiconductor structure according to claim 1, wherein the first doping type is n-type, and the second doping type is p-type.

12. The semiconductor structure according to claim 1, being used in ESD protection application.

* * * * *